United States Patent
Mano et al.

(10) Patent No.: US 12,225,331 B2
(45) Date of Patent: Feb. 11, 2025

(54) NETWORK CONFIGURATION ENUMERATION DEVICE, NETWORK CONFIGURATION ENUMERATION METHOD AND NETWORK CONFIGURATION ENUMERATION PROGRAM

(71) Applicant: NIPPON TELEGRAPH AND TELEPHONE CORPORATION, Tokyo (JP)

(72) Inventors: Toru Mano, Musashino (JP); Takeru Inoue, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 322 days.

(21) Appl. No.: 17/637,042

(22) PCT Filed: Sep. 25, 2019

(86) PCT No.: PCT/JP2019/037493
§ 371 (c)(1),
(2) Date: Feb. 21, 2022

(87) PCT Pub. No.: WO2021/059378
PCT Pub. Date: Apr. 1, 2021

(65) Prior Publication Data
US 2022/0303645 A1 Sep. 22, 2022

(51) Int. Cl.
*H04Q 1/02* (2006.01)
*G01R 31/60* (2020.01)

(52) U.S. Cl.
CPC ............ *H04Q 1/13* (2013.01); *G01R 31/60* (2020.01)

(58) Field of Classification Search
CPC ............ H04Q 1/13; H04Q 3/52; G01R 31/60
See application file for complete search history.

(56) References Cited

U.S. PATENT DOCUMENTS

| 10,720,969 B2 * | 7/2020 | Lea .................. H04B 1/401 |
| 2006/0132301 A1 * | 6/2006 | Stilp .................. G08B 25/10 340/539.22 |
| 2018/0264347 A1 * | 9/2018 | Tran .................. A63B 69/38 |

OTHER PUBLICATIONS

A. S. Kewitsch, "Large scale, all-fiber optical cross-connect switches for automated patch-panels", Journal of Lightwave Technology, vol. 27, No. 15, pp. 3107-3115, Aug. 2009.

(Continued)

*Primary Examiner* — Jean F Duverne

(57) ABSTRACT

An object of the present disclosure is to propose a technique to enumerate intermediate configurations at high speeds. A configuration enumeration device 10 according to the present disclosure enumerates a network configuration in an input layer 21, an intermediate layer 22, and an output layer 23 that minimizes the number of mechanical patch panels provided in mechanical patch panels, by using α-quasi-nonblocking configurations, where α being 0 indicates a rearrangeably nonblocking configuration and α being 1 indicates a strictly nonblocking configuration, for 0≤α≤1, when a minimum value C of wiring capacity of mechanical patch panels having the input layer 21, the intermediate layer 22, and the output layer 23 is obtained.

5 Claims, 10 Drawing Sheets

(56) References Cited

OTHER PUBLICATIONS

F. Hwang, "The mathematical theory of nonblocking switching networks", World Scientific, 2004, vol. 15.
T. Mano, T. Inoue, K. Mizutani, and O. Akashi, "Increasing capacity of the clos structure for efficient nonblocking networks", IEICE Technical Report, vol. 118, No. 466, pp. 25-30, 2019.

* cited by examiner

| $\alpha(x)$ | $k_x$ | $l_x$ | $m_x$ | $n_x$ |
|---:|---:|---:|---:|---:|
| 0 | 10 | 10 | 10 | 100 |
| 0.1 | 12 | 12 | 8 | 84 |
| 0.182 | 12 | 14 | 7 | 84 |
| 0.2 | 13 | 13 | 7 | 77 |
| 0.3 | 13 | 14 | 7 | 77 |
| 0.364 | 14 | 16 | 6 | 72 |
| 0.4 | 16 | 15 | 6 | 63 |
| 0.5 | 16 | 16 | 6 | 63 |
| 0.545 | 17 | 18 | 5 | 59 |
| 0.583 | 16 | 20 | 5 | 63 |
| 0.636 | 17 | 19 | 5 | 59 |
| 0.727 | 17 | 20 | 5 | 59 |
| 0.778 | 20 | 17 | 5 | 50 |
| 0.8 | 19 | 19 | 5 | 53 |
| 0.888 | 20 | 18 | 5 | 50 |
| 0.9 | 19 | 20 | 5 | 53 |
| 1 | 20 | 19 | 5 | 50 |

| $\alpha(x)$ | $k_x$ | $l_x$ | $m_x$ | $n_x$ |
|---|---|---|---|---|
| 0 | 8 | 8 | 16 | 125 |
| 0.143 | 9 | 9 | 14 | 112 |
| 0.222 | 10 | 12 | 10 | 100 |
| 0.25 | 11 | 11 | 11 | 91 |
| 0.375 | 12 | 12 | 10 | 84 |
| 0.444 | 12 | 14 | 9 | 84 |
| 0.5 | 13 | 13 | 9 | 77 |
| 0.571 | 14 | 12 | 9 | 72 |
| 0.625 | 13 | 14 | 9 | 77 |
| 0.714 | 14 | 13 | 9 | 72 |
| 0.857 | 14 | 14 | 9 | 72 |
| 0.857 | 14 | 16 | 8 | 72 |
| 1 | 16 | 15 | 8 | 63 |

| $\alpha(x)$ | $k_x$ | $l_x$ | $m_x$ | $n_x$ |
|---:|---:|---:|---:|---:|
| 0 | 10 | 10 | 100 | 1000 |
| 0.1 | 11 | 12 | 83 | 910 |
| 0.2 | 12 | 13 | 76 | 834 |
| 0.3 | 13 | 14 | 70 | 770 |
| 0.4 | 14 | 15 | 65 | 715 |
| 0.5 | 15 | 16 | 61 | 667 |
| 0.6 | 16 | 17 | 57 | 625 |
| 0.7 | 17 | 18 | 54 | 589 |
| 0.727 | 17 | 20 | 50 | 589 |
| 0.8 | 18 | 19 | 51 | 556 |
| 0.818 | 18 | 21 | 47 | 556 |
| 0.888 | 20 | 18 | 50 | 500 |
| 0.9 | 19 | 20 | 48 | 527 |
| 1 | 20 | 19 | 50 | 500 |

NETWORK CONFIGURATION ENUMERATION DEVICE, NETWORK CONFIGURATION ENUMERATION METHOD AND NETWORK CONFIGURATION ENUMERATION PROGRAM

CROSS-REFERENCE TO RELATED APPLICATIONS

This application is a 371 U.S. National Phase of International Application No. PCT/JP2019/037493, filed on Sep. 25, 2019. The entire disclosures of the above applications are incorporated herein by reference.

TECHNICAL FIELD

The present disclosure relates to a method of enumerating a plurality of network configurations with a plurality of mechanical patch panels.

BACKGROUND ART

Optical fiber wiring is a troublesome task, but is an essential basis for fast and robust network services. The operating costs for these tasks in a network station building are large. This is because these operations usually require the creation of work procedures manuals, dispatching two operators connecting to the network equipment at both ends of the cable, testing of cable communication and power level, and a controller of these tasks. In addition, the operators may mistakenly wire the cables, which causes deterioration of quality of service and/or additional work to correct these operational errors.

By using a mechanical patch panel (NPL 1), the wiring operation can be performed remotely and automatically. However, because a single mechanical patch panel cannot accommodate all of the wiring lines of the network station building, a patch panel network using a plurality of mechanical patch panels needs to be configured.

While it is necessary to accommodate the expected number of wiring lines when configuring a mechanical patch panel network, it is also necessary to achieve the expected connection pattern while reducing the number of mechanical patch panels to be used.

In configuring a large switching network from small switching components such as mechanical patch panels, nonblocking networks have been utilized so that any connection pattern can be achieved (NPL 2, 3). The nonblocking networks are roughly classified into two of strictly nonblocking and rearrangeably nonblocking depending on the levels of nonblocking (NPL 2).

In the strictly nonblocking, equipment costs may become large because a large number of mechanical patch panels are used, and in the rearrangeably nonblocking, manual wiring operations may occur and the operation costs may increase because the expected connection patterns cannot be achieved. The strictly nonblocking network can achieve any connection pattern, but the number of mechanical patch panels required is increased compared to the rearrangeably nonblocking network. In practice, it is not necessary to accommodate any connection, but it is sufficient to accommodate the expected connections, so the strictly nonblocking configuration may result in excessive equipment investment. On the other hand, in the rearrangeably nonblocking configuration, the already-installed wiring needs to be rearranged to be the nonblocking. If the already-installed wiring is rearranged in the network station, the communication is disconnected, so such rearranging is not possible. Thus, in the rearrangeably nonblocking configuration, the expected connection patterns may not be feasible.

For example, in a case where a patch panel network having a mechanical patch panel size of 1000 and a wiring capacity of 10000 is configured, 59 mechanical patch panels are necessary in the strictly nonblocking configuration, but 30 mechanical patch panels are sufficient in the rearrangeably nonblocking configuration. That is, in a case where the expected connection patterns cannot be achieved in the rearrangeably nonblocking configuration, the strictly nonblocking having approximately twice the number of mechanical patch panels used must be used.

In such cases, a technique to enumerate network configurations that fall somewhere in between the strictly nonblocking and the rearrangeably nonblocking, that is, network configurations such that the number of mechanical patch panels used is greater than that of the rearrangeably nonblocking and less than that of the strictly nonblocking, and less likely to become blocking states than the rearrangeably nonblocking (strictly nonblocking cannot become blocking states), and to find a configuration among them in which the probability of becoming blocked in the expected connection patterns is sufficiently small (for example, probability equivalent to once in 100 years) and the number of mechanical patch panels used is minimal is considered.

For the configurations that fall somewhere in between, as described in the following section, by introducing a parameter $\alpha \in [0, 1]$, a configuration to be the rearrangeably nonblocking configuration at $\alpha=0$ and the strictly nonblocking configuration at $\alpha=1$ can be defined. Thus, intermediate configurations can be enumerated by solving an optimization problem that minimizes the number of mechanical patch panels used for each $\alpha \in [0, 1]$, with the wiring capacity as the constraint.

However, because the parameter $\alpha \in [0, 1]$ is a real number, the possible value is infinite, and it is not possible to calculate the optimization problem described above for each $\alpha$. Thus, a method is conceivable in which a positive integer $h$ is selected, and an optimization problem is calculated for $h+1$ points $\{i/h | i \in \{0, 1, \ldots, h\}\}$ instead of the interval $[0, 1]$. However, there are two drawbacks in this method.

Drawback 1: The correct results may not be obtained. This is because the calculation is made for $h+1$ points $\{i/h | i \in \{0, 1, \ldots, h\}\}$ instead of the interval $[0, 1]$.

Drawback 2: It is not clear how much $h$ needs to be large enough to obtain the correct result calculation, and when $h$ increases, the number of optimization calculations increases, which increases the computational time. Specifically, the number of optimization calculations is $O(h)$ times.

CITATION LIST

Non Patent Literature

NPL 1: A. S. Kewitsch, "Large scale, all-fiber optical cross-connect switches for automated patch-panels," Journal of Lightwave Technology, vol. 27, no. 15, pp. 3107-3115, August 2009.

NPL 2: F. Hwang, The mathematical theory of nonblocking switching networks. World Scientific, 2004, vol 15.

NPL 3: M. Toru, I. Takeru, K. Mizutani, and O. Akashi, "Increasing capacity of the clos structure for efficient nonblocking networks," IEICE Technical Report, vol. 118, no. 466, pp. 25-30, 2019.

SUMMARY OF THE INVENTION

Technical Problem

An object of the present disclosure is to propose a technique to enumerate intermediate configurations at high speeds.

Means for Solving the Problem

In order to achieve the object described above, the present disclosure uses the algorithm Search to enumerate configurations×($\alpha$) of a mechanical patch panel network that minimizes the number of mechanical patch panels at a capacity of C or greater, and that is $\alpha$-quasi-nonblocking configuration that is a rearrangeably nonblocking configuration when $\alpha=0$ and is a strictly nonblocking configuration when $\alpha=1$, for $0 \leq \alpha \leq 1$.

The configuration enumeration device according to the present disclosure uses parameters $\alpha$ calculated by using, when a minimum value C of wiring capacity of mechanical patch panels having an input layer, an intermediate layer, and an output layer is obtained, the number of connections with the intermediate layer per one mechanical patch panel, and the number of input terminals and the number of output terminals per one mechanical patch panel in a search range, and calculates a network configuration of the input layer, the intermediate layer, and the output layer that minimizes the number of mechanical patch panels from among $\alpha$-quasi-nonblocking configurations for each of all the parameters $\alpha$ satisfying $0 \leq \alpha \leq 1$, where $\alpha$ being 0 indicates a rearrangeably nonblocking configuration and $\alpha$ being 1 indicates a strictly nonblocking configuration.

The configuration enumeration method according to the present disclosure uses parameters $\alpha$ calculated by using, when a minimum value C of wiring capacity of mechanical patch panels having an input layer, an intermediate layer, and an output layer is obtained, the number of connections with the intermediate layer per one mechanical patch panel, and the number of input terminals and the number of output terminals per one mechanical patch panel in a search range, and calculates a network configuration of the input layer, the intermediate layer, and the output layer that minimizes the number of mechanical patch panels from among $\alpha$-quasi-nonblocking configurations for each of all the parameters $\alpha$ satisfying $0 \leq \alpha \leq 1$, where a being 0 indicates a rearrangeably nonblocking configuration and $\alpha$ being 1 indicates a strictly nonblocking configuration.

The configuration enumeration program according to the present disclosure is a program for causing a computer to implement each step included in the method according to the present disclosure, and is a program for causing the computer to be implemented as functional units included in the device according to the present disclosure. The program may be recorded on a computer-readable recording medium.

The present disclosure encompasses a configuration enumeration system including a configuration enumeration device according to the present disclosure and mechanical patch panels. The present disclosure also encompasses a patch panel network configured using the configuration enumeration device or the configuration enumeration method according to the present disclosure. The present disclosure also encompasses a control apparatus and a control method for controlling a patch panel network to be the patch panel network configured using the configuration enumeration device or the configuration enumeration method according to the present disclosure. The present disclosure also encompasses a communication method that performs communication using the patch panel network configured using the configuration enumeration device or the configuration enumeration method according to the present disclosure.

Effects of the Invention

According to the present disclosure, by performing the optimization calculation at the 0 (M log N) points with M as the number of network configurations to be output and N as the size of the mechanical patch panel, the same set as the case of performing the optimization calculation at each $\alpha \in [0, 1]$ can be obtained. As a result, the present disclosure can obtain a set of network configurations, capable of achieving the expected connection patterns, at high speeds and accurately while reducing the number of mechanical patch panels to be used.

BRIEF DESCRIPTION OF DRAWINGS

FIG. 8 is an example of a calculation result for (N, C)=(100, 1000) in which a nonblocking sequence is calculated using the algorithm according to the present disclosure.

FIG. 9 is an example of a calculation result for (N, C)=(128,1000) in which a nonblocking sequence is calculated using the algorithm according to the present disclosure.

FIG. 10 is an example of a calculation result for (N, C)=(1000, 10000) in which a nonblocking sequence is calculated using the algorithm according to the present disclosure.

DESCRIPTION OF EMBODIMENTS

Hereinafter, embodiments of the present disclosure will be described in detail with reference to the drawings. Note that the present disclosure is not limited to the embodiments described below. These embodiments are just illustrative examples, and the present disclosure can be implemented in forms in which various modifications and improvements are added on the basis of knowledge of those skilled in the art. Note that components with the same reference signs in the specification and the drawings are assumed to be the same components.

Figure 1:
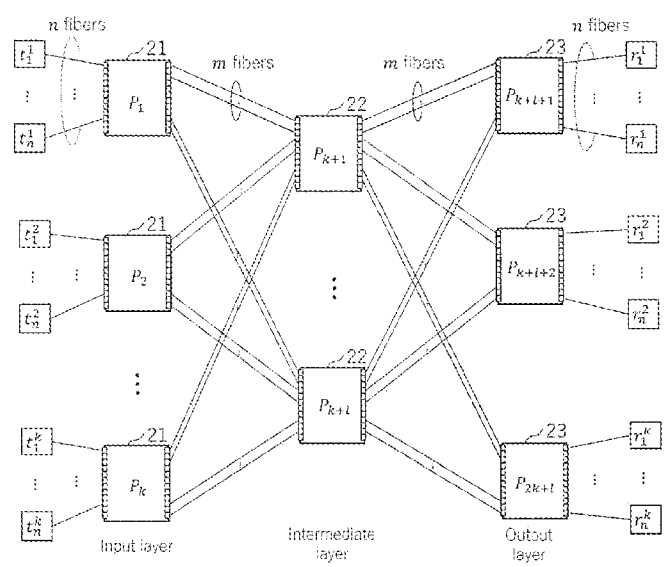
FIG. 1 illustrates an example of a network configuration including a mechanical patch panel network.

FIG. 1 illustrates an example of a network configuration according to the present disclosure. The network configuration according to the present disclosure includes an input layer 21, an intermediate layer 22, and an output layer 23.

The input layer 21 is mechanical patch panels connected to input terminals. The output layer 23 is mechanical patch panels connected to output terminals. The intermediate layer 22 is mechanical patch panels that connect between the input layer 21 and the output layer 23.

Configurations with an intermediate nature of strictly nonblocking and rearrangeably nonblocking will be defined, a problem of enumerating them will be defined, and an algorithm to enumerate them will be described. Thus, the strictly nonblocking and the rearrangeably nonblocking will be defined first.

In the present disclosure, only a three-layer configuration as in FIG. 1 is considered. This is because when the hierarchy becomes deeper, the attenuation and noise of the light become large. For positive real number x≥0,

[Math. 1-1]

$$\lfloor x \rfloor \tag{1-1}$$

is defined as the maximum integer less than or equal to x, and

[Math. 1-2]

$$\lceil x \rceil \tag{1-2}$$

is defined as the minimum integer greater than or equal to x. Specific examples are as follows.

[Math. 1-3]

$$\lfloor 1.3 \rfloor = 1 \tag{1-3}$$

and

[Math. 1-4]

$$\lceil 0.8 \rceil = 1 \tag{1-4}$$

Definition of Nonblocking Network

As illustrated in FIG. 1, mechanical patch panels in which the number of mechanical patch panels in the input layer and the output layer, the number of mechanical patch panels in the intermediate layer, the number of connections with the intermediate layer per one mechanical patch panel, and the number of input (output) terminals per one mechanical patch panel are k, l, m, and n, respectively, are written as (k, l, m, n). It is assumed that all mechanical patch panels are at the same size, as N×N, or with N inputs and N outputs.

Strictly Nonblocking

The strictly nonblocking is a network in which it is not possible to rearrange the already-installed wiring and it is nonblocking (any connection pattern can be achieved) regardless of the selection of the connection path, and the necessary and sufficient conditions are as follows (NPL 2).

[Math. 1]

$$2\left\lfloor \frac{n-1}{m} \right\rfloor + 1 \leq l \tag{1}$$

Thus, the strictly nonblocking network that minimizes the number of mechanical patch panels with the wiring capacity of C or greater is obtained by solving the following optimization problem.

[Math. 2]

$$\min 2k + l \tag{2}$$

$$\text{s.t. } n \leq N \tag{3}$$

$$m \cdot l \leq N \tag{4}$$

$$m \cdot k \leq N \tag{5}$$

$$2\left\lfloor \frac{n-1}{m} \right\rfloor + 1 \leq l \tag{6}$$

$$n \cdot k \geq C \tag{7}$$

Rearrangeably Nonblocking

The rearrangeably nonblocking is a network in which it is possible to rearrange the already-installed wiring and it is nonblocking (any connection pattern can be achieved) by correctly selecting the connection path, and the necessary and sufficient conditions are as follows (NPL 2).

[Math. 8]

$$n \leq ml \tag{8}$$

Thus, the rearrangeably nonblocking that minimizes the number of mechanical patch panels with the wiring capacity of C or greater is obtained by solving the following optimization problem.

[Math. 9]

$$\min 2k+l \tag{9}$$

$$\text{s.t. } n \leq N \tag{10}$$

$$m \cdot l \leq N \tag{11}$$

$$m \cdot k \leq N \tag{12}$$

$$n \leq ml \tag{13}$$

$$n \cdot k \geq C \tag{14}$$

Quasi-Nonblocking (Intermediate Nonblocking Configuration)

As described in the problems, in the strictly nonblocking, equipment costs may become large because a large number of mechanical patch panels are used, and in the rearrangeably nonblocking, manual wiring operations may occur and the operation costs may increase because the expected connection patterns cannot be achieved. For example, in a case where a patch panel network having a mechanical patch panel size N of 1000 and a wiring capacity C of 10000 is configured, 59 mechanical patch panels are necessary in the strictly nonblocking configuration, but 30 mechanical patch panels are sufficient in the rearrangeably nonblocking configuration. That is, in a case where the expected connection patterns cannot be achieved in the rearrangeably nonblocking configuration, the strictly nonblocking having approximately twice the number of mechanical patch panels used must be used.

In order to address such a situation, a technique to enumerate network configurations that fall somewhere in between the strictly nonblocking and the rearrangeably nonblocking, that is, network configurations such that the number of mechanical patch panels used is greater than that of the rearrangeably nonblocking and less than that of the strictly nonblocking, and less likely to become blocking states than the rearrangeably nonblocking (strictly nonblocking cannot become blocking states), and to find a configuration among them in which the probability of becoming blocked in the expected connection patterns is sufficiently small (for example, probability equivalent to once in 100 years) and the number of mechanical patch panels used is minimal is considered.

The intermediate network configuration as described above can be defined by introducing a parameter $\alpha \in [0, 1]$. The intermediate network configuration is a network configuration that becomes rearrangeably nonblocking at $\alpha=0$ and becomes strictly nonblocking at $\alpha=1$.

First, note that, in the optimization problem that minimizes the number of mechanical patch panels used with the wiring capacity of C or greater, only the nonblocking conditions (1) and (8) described above differ between the strictly nonblocking network and the rearrangeably nonblocking network. Each nonblocking condition can be transformed as follows.

[Math. 15]

$$2\left\lfloor \frac{n-1}{m} \right\rfloor + 1 \leq l \Longleftrightarrow 2\left\lceil \frac{n}{m} \right\rceil - 1 \leq l \quad (15)$$

$$n \leq ml \Longleftrightarrow \left\lceil \frac{n}{m} \right\rceil \leq l \quad (16)$$

where, when n and m are positive integers,

[Math. 15-1]

$$\lfloor (n-1)/m \rfloor = \lceil n/m \rceil - 1 \quad (15\text{-}1)$$

is used. This can be derived as follows.

[Math. 15-2]

$$\lceil l/m \rceil = \lfloor (n+m-1)/m \rfloor = \lfloor (n-1)/m \rfloor + 1 \quad (15\text{-}2)$$

Consider the convex combination of two nonblocking conditions using the parameter $\alpha \in [0, 1]$ to consider the configuration between the rearrangeably nonblocking and the strictly nonblocking. Provided that the convex combination of the two points is equal to the line segment connecting the two points, namely the set of points that exist between the two points.

[Math. 17]

$$(1-\alpha)\left(2\left\lceil \frac{n}{m} \right\rceil - 1\right) + \alpha\left\lceil \frac{n}{m} \right\rceil = (1+\alpha)\left\lceil \frac{n}{m} \right\rceil - \alpha \leq l \quad (17)$$

This condition corresponds to the rearrangeably nonblocking condition at $\alpha=0$, and the strictly nonblocking condition at $\alpha=1$. Thus, a mechanical patch panel network satisfying the condition (17) is defined as an intermediate network configuration between the strictly nonblocking and the rearrangeably nonblocking. A mechanical patch panel network satisfying the condition (17) is referred to as "α-quasi-nonblocking".

In the same manner as the strictly nonblocking and the rearrangeably nonblocking, a mechanical patch panel network in which the number of mechanical patch panels is minimized at the capacity of C or greater is obtained by solving the following.

[Math. 18]

$$\min 2k + l \quad (18)$$

$$s.t. \; n \leq N \quad (19)$$

$$m \cdot l \leq N \quad (20)$$

$$m \cdot k \leq N \quad (21)$$

$$(1+\alpha)\left\lceil \frac{n}{m} \right\rceil - \alpha \leq l \quad (22)$$

$$n \cdot k \geq C \quad (23)$$

The set of mechanical patch panel networks (k, l, m, n) satisfying the five constraints of (19) to (23) above is written as F ($\alpha$). At this time, F (0) is a set of rearrangeably nonblocking networks, and F (1) is a set of strictly nonblocking networks.

Enumeration Problem

An α-quasi-nonblocking network that minimizes the number of mechanical patch panels used in each $\alpha \in [0, 1]$ is calculated. An object is to look for a network configuration in which the probability of becoming blocking in the expected connection patterns is sufficiently small among them. To do so, an α-quasi-nonblocking network that minimizes the number of mechanical patch panels used in each $\alpha \in [0, 1]$ is calculated. This set (sequence) is referred to as a nonblocking sequence (considered as a sequence which is ordered by a).

Thus, a mechanical patch panel network (k, l, m, n) that minimizes the number of mechanical patch panels used in α-quasi-nonblocking for $\alpha \in [0, 1]$ is defined as x ($\alpha$).

[Math. 24]

$$x(\alpha) = \operatorname{argmin}_{(k,l,m,n) \in F(\alpha)} 2k + l. \quad (24)$$

Thus, the quasi-nonblocking sequence is {x ($\alpha$)|$\alpha \in$ [0, 1]}, and the object is to obtain the set of the sequence. By definition, x (0) is a rearrangeably nonblocking network that minimizes the number of mechanical patch panels used with a capacity of C or greater, and x (1) is a strictly nonblocking network that minimizes the number of mechanical patch panels used with a capacity of C or greater.

Problems in Enumeration Problem

Because the parameter $\alpha \in [0, 1]$ is a real number, the possible value is infinite, and it is not possible to calculate Equation (24) for each $\alpha$. Thus, a method for calculating {x (i/h)|i $\in$ {0, 1, . . . , h}} for a positive integer h is conceivable, but there are two drawbacks in this method.

Drawback 1: The correct results may not be obtained. This is because the calculation is made for h+1 points {i/h|c {0, 1, . . . , h}} instead of the interval [0, 1]. Drawback 2: It is not clear how much h needs to be large enough to obtain the correct result calculation, and when h increases, the number of times to calculate Equation (24) increases, which increases the computational time. Specifically, the number of times to calculate Equation (24) is O (h) times.

The present disclosure proposes an algorithm that calculates a nonblocking sequence {x ($\alpha$)|$\alpha \in$[0, 1]} in O (M log N) times of calculation of Equation (24). Where M is the number of elements in the nonblocking sequence, i.e. M=|{x ($\alpha$)|$\alpha \in$[0, 1]}|. The number of elements M in the nonblocking sequence is M=14, for example, when the mechanical patch panel size N is 100 and the capacity C of the mechanical patch panel network is 1000, and M=13 for N=128 and C=1000.

Proposed Technique

First, parameters for describing the algorithm are defined. For the mechanical patch panel network configuration $x=(k, l, m, n) \in F(\alpha)$, write $k_x=k$, $l_x=l$, $m_x=m$, $n_x=n$. The same applies to the network configurations y and z. An equation is set as follows.

$$q_x = \lceil n_x/m_x \rceil \quad \text{[Math. 25-1]}$$

Then $\alpha$ (x) and $\delta$ (y, z) are defined as follows.

[Math. 25]

$$\alpha(x) = \begin{cases} \dfrac{l_x - q_x}{q_x - 1} & q_x > 1 \\ 1 & q_x = 1 \end{cases} \quad (25)$$

[Math. 26]

$$\delta(y, z) = \frac{1}{l_y(2k_z + l_z)} \quad (26)$$

The following is the algorithm Search for calculating the nonblocking sequence. Nonblocking sequences are enumerated as binary search.

Algorithm: in Search, steps S01 to S03 are performed sequentially.

Input: wiring capacity C, mechanical patch panel size N

Output: nonblocking sequence.

Step S11. $x_0 \leftarrow x(0)$

The nonblocking sequence x (0) at $\alpha=0$, or in the rearrangeably nonblocking network, is calculated by using Equation (24). In this way, $x_0$ is calculated.

Step S12. $x_1 \leftarrow x(1)$

The nonblocking sequence x (1) at $\alpha=1$, or in the strictly nonblocking, is calculated by using Equation (24). In this way, $x_1$ is calculated.

Step S13. SubSearch ($x_0$, $x_1$, $\alpha(x_0)$, 1) SubSearch, which is a subroutine, is executed by using $x_0$, $x_1$, a ($x_0$), 1 as the parameters. The parameter $x_0$ is the nonblocking sequence x (0) calculated in step S11. The parameter $x_1$ is the nonblocking sequence x (1) calculated in step S12. The parameter $\alpha$ ($x_0$) is a value calculated by using Equation (25).

The subroutine SubSearch will be described.

Algorithm: SubSearch (y, z, β,γ)

Input conditions: mechanical patch panel networks y, z satisfying y=x (β), z=x (y), and β=α (y).

Output: {x (α) |α ∈ [β,γ]}, which is part of the nonblocking sequence.

Step S31. if $\gamma-\beta<\delta$(y, z), then {y, z} is output and the process ends.

Figure 2:
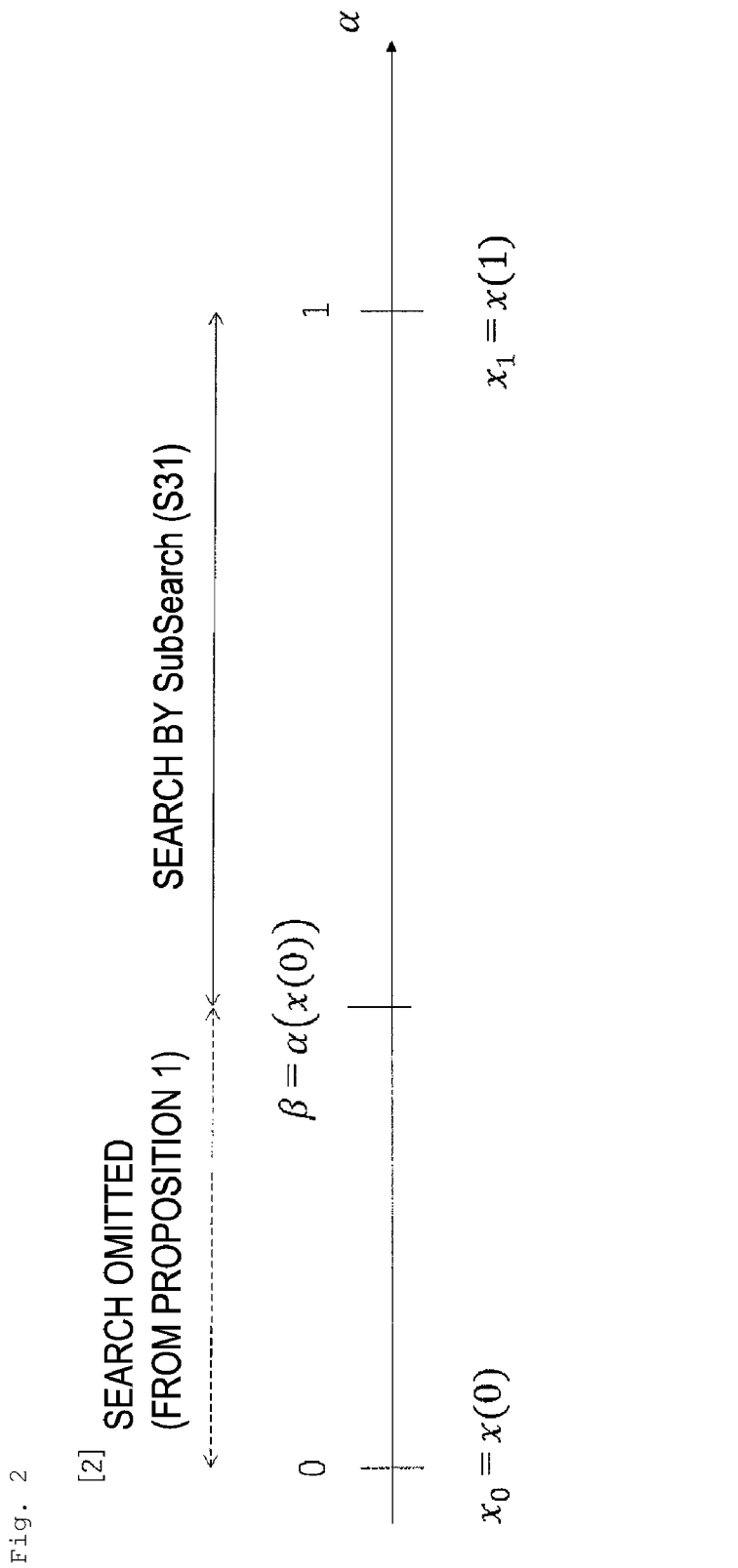
FIG. 2 illustrates a split example of the search range in step S13.
Figure 3:
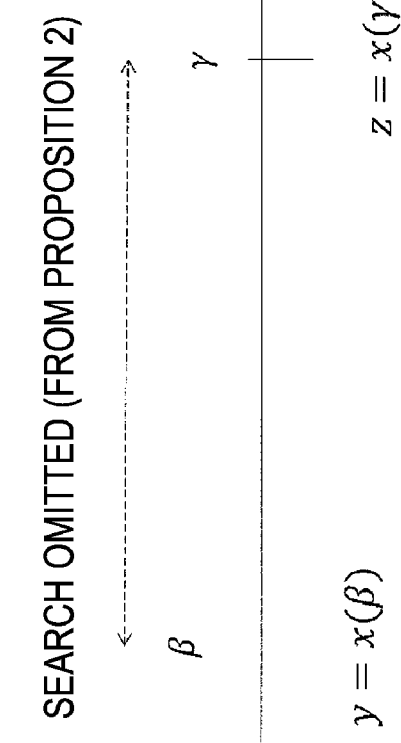
FIG. 3 illustrates a split example of the search range in step S31 (in the case of $\gamma-\beta<\delta$ (y, z)).

Specifically, the parameters $x_0$, $x_1$, $\alpha$ ($x_0$), and 1 are used for y, z, β, and γ to determine $\gamma-\beta<\delta$ (y, z). In a case where $\gamma-\beta<\delta$ (y, z) is satisfied, the nonblocking sequence x (α) in a case where the value of a is changed from β to γ, as illustrated in FIG. 2, is calculated. In this way, the nonblocking sequence x (α) in which a has been searched from α ($x_0$) to 1 is output. In this case, as illustrated in FIG. 3, α search for a from δ to γ is omitted.

In a case where $\gamma-\beta\delta$ (y, z) is not satisfied in step S31, i.e., in a case of $\gamma-\beta>\delta$(y, z), step S32 is performed.

Step S32. x' ← ((β+γ)/2)

The nonblocking sequence x (α) in a case where (β+γ)/2 is used for a is calculated by using Equation (24). In this way, x' is calculated.

Then, whether or not x'=z is determined. If x'=z, then step S33-1 is performed, and if x'≠z, step S33-2 is performed.

Step S33-1. if x'=z

SubSearch (y, z, β, (β+γ)/2)

Figure 4:
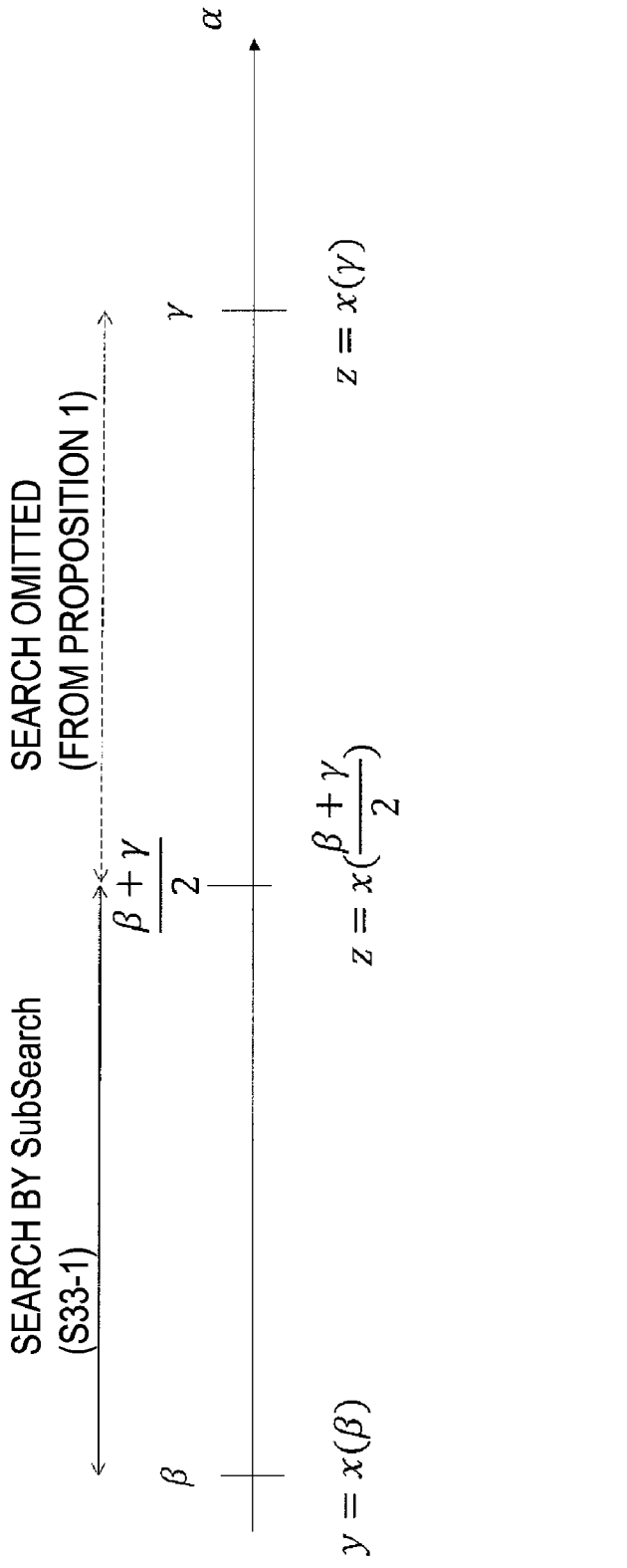
FIG. 4 illustrates a split example of the search range in step S33-1 (in the case of x'=z).

The nonblocking sequence x (α) in a case where the value of α is changed from β to (β+γ)/2, as illustrated in FIG. 4, is calculated.

Step S33-2. if x'≠z $S_1 \leftarrow$ SubSearch (y, x',β, (β+γ)/2)

Figure 5:
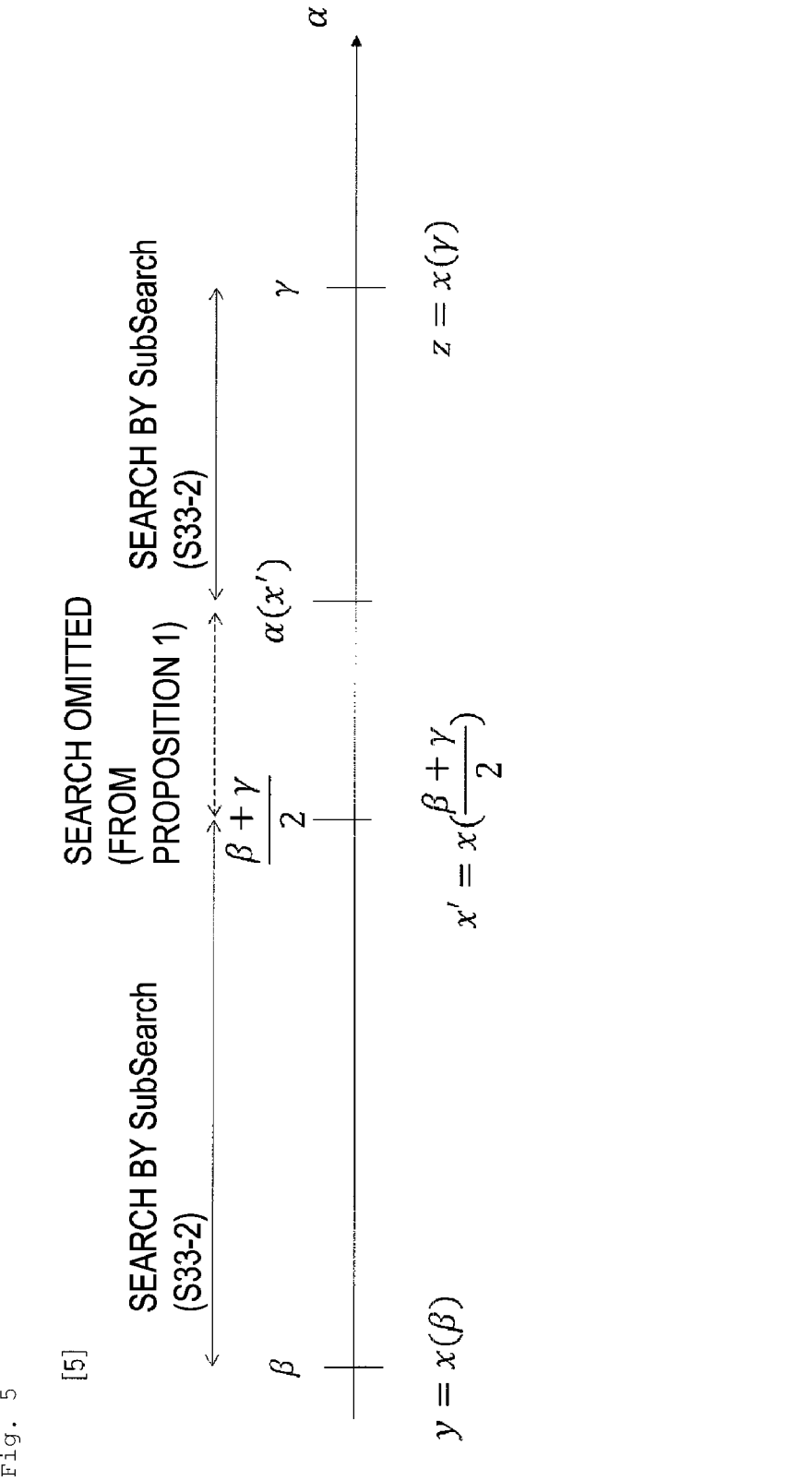
FIG. 5 illustrates a split example of the search range in step S33-2 (in the case of x'≠z).

The nonblocking sequence x (α) in a case where the value of α is changed from β to (β+γ)/2 using x' in z, as illustrated in FIG. 5, is calculated.

$S_2 \leftarrow$ SubSearch (x', z, α (x'), γ)

The nonblocking sequence x (α) in a case where the value of a is changed from a (x') to γ using x' in y, as illustrated in FIG. 5, is calculated.

$S_1 \cup S_2$ is output and the process ends.

Figure 6:
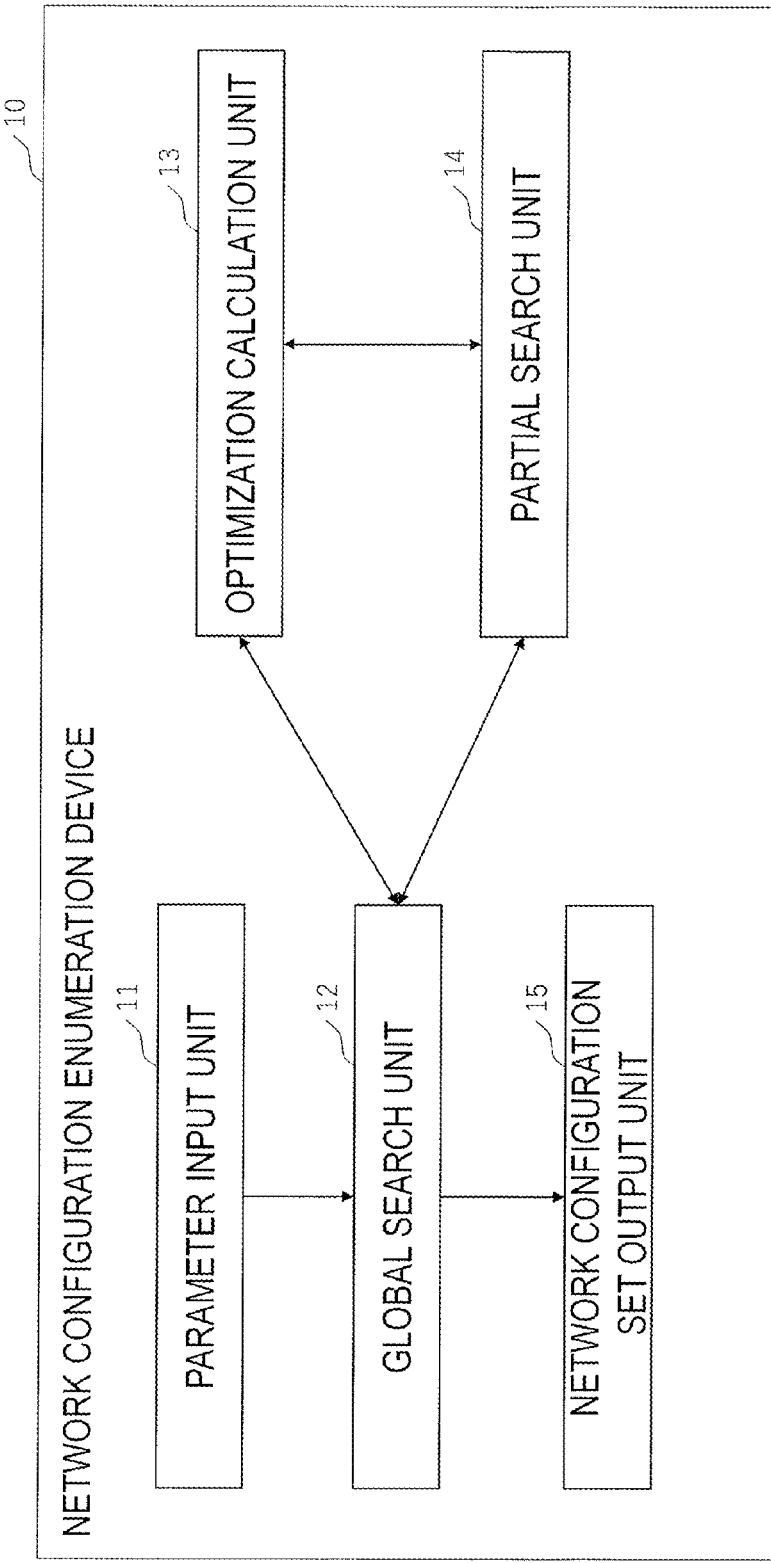
FIG. 6 is a block configuration diagram illustrating an example of a network configuration enumeration device.

FIG. 6 illustrates a diagram of an apparatus configuration for calculating a nonblocking sequence. The network configuration enumeration device 10 according to the embodiments includes a parameter input unit 11, a global search unit 12, an optimization calculation unit 13, a partial search unit 14, and a network configuration set output unit 15. The network configuration set output unit 15 outputs the Search results of the global search unit 12. The parameter input unit 11 inputs parameters used by the global search unit 12, the optimization calculation unit 13, and the partial search unit 14. The global search unit 12 executes the Search, the partial search unit 14 executes the SubSearch, and the optimization calculation unit 13 calculates the optimization problem (24). First, the algorithm correctness will be shown, and then the calculation amount will be shown.

Validity of Algorithm

The intervals not searched during the execution of the algorithm Search is as follows.

(C1) interval [0, α ($x_0$)] in step S13 of Search (FIG. 2).

(C2) interval [β,γ] in step S31 of SubSearch (FIG. 3).

(C3) interval [(β+γ)/2, γ] in step S33-1 of SubSearch (FIG. 4)

(C4) interval [(β+γ)/2, α (x')] in step S33-2 of SubSearch (FIG. 5).

Thus, it is only required to show that these C1, C2, C3, and C4 are not necessary to search.

To do so, it is sufficient to show the following two propositions.

Proposition 1. y=x ((3). At this time, y minimizes 2k+1 on F (y) for any γ ∈ [β,α (y)]

Proposition 2. y=x ((3), z=x (γ), β=α (y), and $\gamma-\beta<\delta$ (y, z). At this time, z minimizes 2k+1 on F (a') for any α' ∈ (β,γ].

The validity of the algorithm will be described before proof of Propositions 1 and 2. According to Proposition 1, the interval [β,α (y)] does not need to be searched when y=x (β). This is because y minimizes the used mechanical patch panels 2k+1. According to Proposition 2, the interval [β,γ] also does not need to be searched if β and γ of SubSearch are sufficiently close, specifically, satisfy $\gamma-\beta<\delta$(y, z). This is because z minimizes the used mechanical patch panels 2k+1. Thus, Proposition 1 shows that C1, C3, and C4 do not need to be searched, and Proposition 2 shows that C2 does not need to be searched. This is because $x_0$, z, z, and x' minimize 2k+1 in the target interval in C1, C2, C3, and C4, respectively.

Next, lemmas necessary for proof of the propositions will be shown. Lemma 1 shows that mechanical patch panel networks satisfying constraints are monotonically non-increasing. Next Lemma 2 shows that the mechanical patch panel network x has an upper limit of a that satisfies the constraints given at a (x).

Lemma 1. If $0 \leq \alpha \leq \beta \leq 1$, then $F(\alpha) \supseteq F(\beta)$.

Proof.

If an equation is set as follows,

[Math. 26-1]

$$\lceil n/m \rceil = q \tag{26-1}$$

then the quasi-nonblocking condition (17) is $(1+\alpha) q-\alpha=q+\alpha(q-1) \leq q+\beta(q-1)$. Thus, if $x \in F(\beta)$, then $F(\alpha)$, so $F(\alpha) \supseteq F(\beta)$ is established.

Lemma 2. If $y=x(\beta)$, $y \in F(\gamma)$ is established for any $\gamma \in [\beta, \alpha(y)]$.

Proof. By definition, $y \in F((3)$, thus from Lemma 1, it is sufficient to show $y \in F(\alpha(y))$. Here, by the definition of $\alpha(y)$, $(1+\alpha(y)) q_y + \alpha(y) = 1_y$ is established. Thus, $y \in F(\alpha(y))$. At the same time, if $\gamma > \alpha(y)$, a relationship is established as follows.

[Math. 26-2]

$$y \notin F(\gamma) \tag{26-2}$$

Finally, Propositions 1 and 2 will be proved by using the above Lemmas 1 and 2.

Proof of Proposition 1. According to Lemma 2, $y \in F(\gamma)$, so it is only required to show that $z \in F(\gamma)$ satisfying $2k_y + 1_y > 2k_z + 1_z$ does not exist. This is shown by proof by contradiction. Assume that a real number $\gamma \in [\beta, \alpha(y)]$ exists and satisfies $z \in F(\gamma)$ and $2k_y + 1_y > 2k_z + 1_z$. At this time, $\beta \leq \gamma$ and $F(y) \subseteq F(\beta)$, so $z \in F(\beta)$, and it contradicts with $y=x(\beta)$.

Proof of Proposition 2. According to Lemma 1, $z \in F(\alpha')$, so it is only required to show that $x \in F(\alpha')$ satisfying $2k_z + 1_z > 2k_x + 1_x$ does not exist. This is shown by proof by contradiction. Assume that a real number $\alpha' \in (\beta, \gamma]$ exists and satisfies $x \in F(a')$ and $2k_z + 1_z > 2k_x + 1_x$. At this time,

[Math. 27]

$$\gamma - \beta > \alpha(x) - \beta \tag{27}$$

$$= \frac{l_x - q_x}{q_x - 1} - \frac{l_y - q_y}{q_y - 1} \tag{28}$$

$$\geq \frac{1}{(q_x - 1)(q_y - 1)} \tag{29}$$

$$\geq \frac{1}{(2k_x + l_x)l_y} \tag{30}$$

$$> \frac{1}{(2k_z + l_z)l_y} = \delta(y, z) \tag{31}$$

where, $q-1 \leq (1+\alpha) q-\alpha \leq 1 \leq 2k+1$ according to $\beta < \alpha(x) < \gamma$ and the quasi-nonblocking conditions of x', y is used. This contradicts with $\delta(y, z) > \gamma - \beta$.

Calculation Amount

Figure 7:
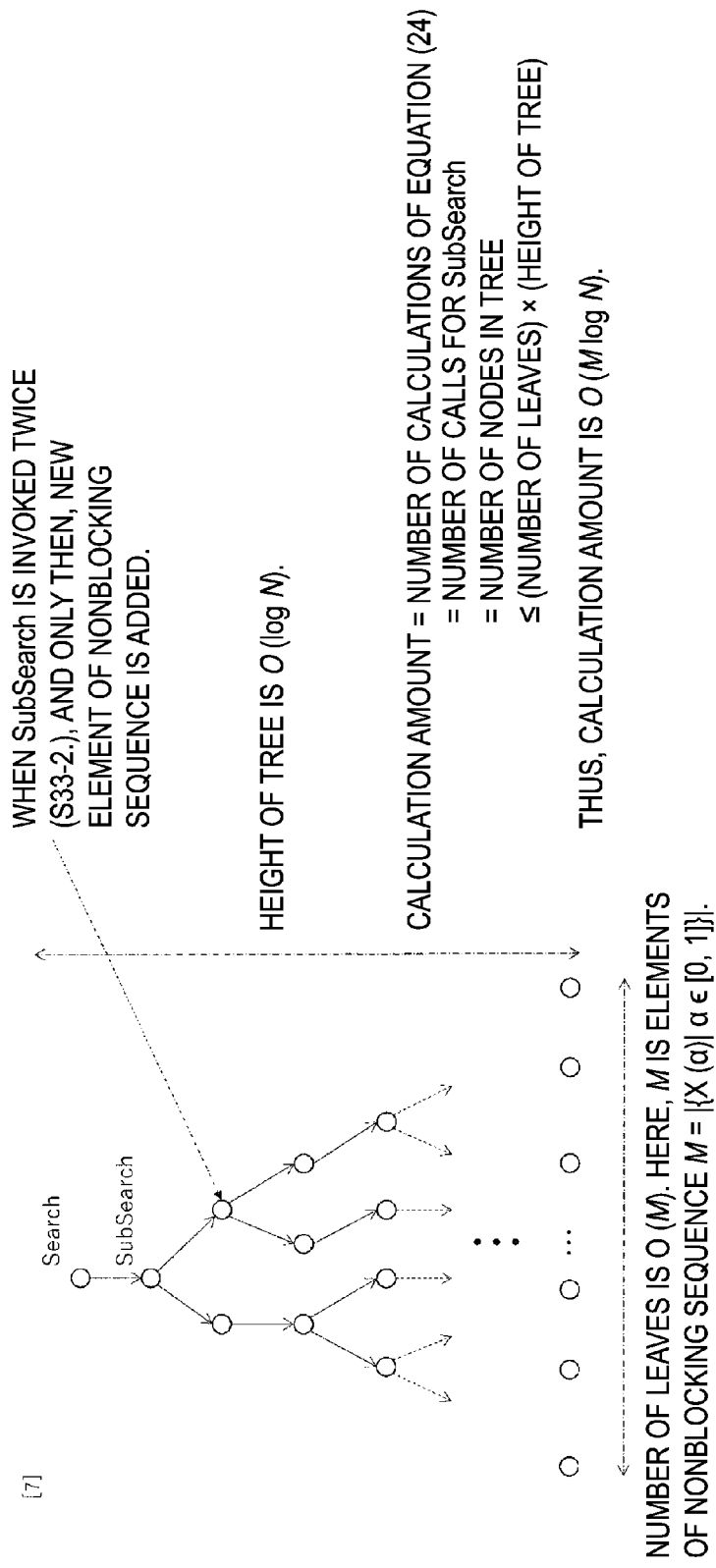
FIG. 7 illustrates an example of a relationship between recursive calls of SubSearch and a calculation amount.

It is sufficient to prove that the depth of the recursive calls of SubSearch in the algorithm Search is O (log N). This is because the calculation of Equation (24) is once at a time of SubSearch, and SubSearch is invoked twice in SubSearch whenever a new element is added to the output sequence and only then. Referring to the call of SubSearch as a directed tree, each contact corresponds to a call of SubSearch, the height of the tree is O (log N), and the number of leaves is O (M). The number of nodes is the number of times of calls of SubSearch, that is, the number of calculations of Equation (24) (FIG. 7).

Because $\gamma-\beta$ is at least halved for each call of SubSearch, it is sufficient to show $\delta(y, z) \geq 1/(3N^2)$. Because the quasi-nonblocking network satisfies Relationships (20) and (21), $k \leq N$ and $1 \leq N$. Thus, a relationship is established as follows.

[Math. 32]

$$\delta(y, z) = \frac{1}{l_y(2k_z + l_z)} \geq \frac{1}{3N^2} \tag{32}$$

Calculation Example

The results of calculating the nonblocking sequences in the algorithm according to the present disclosure are illustrated in FIGS. 8 to 10. The calculation is made by three sets of mechanical patch panel sizes N and capacities C of mechanical patch panel networks (N, C)=(100, 1000), (128, 1000), and (1000, 1000).

Effects of the Invention

It is necessary to solve the optimization problem (24) at each $\alpha \in [0, 1]$, or infinitely, if calculating the quasi-nonblocking sequence $\{x(\alpha)| \alpha \in [0, 1]\}$ as defined, but according to the technique of the present disclosure, the quasi-nonblocking sequence can be obtained by solving the optimization problem (24) in finite $\alpha \in [0, 1]$. The specific number of calculations is O (M log N), where M is the size of the quasi-nonblocking sequence and N is the size of the mechanical patch panel.

Points of the Invention

Nonblocking networks have been utilized, such as strictly nonblocking or rearrangeably nonblocking, when configuring a large switching network from small switching components such as mechanical patch panels.

However, in the strictly nonblocking, equipment costs may become large because a large number of mechanical patch panels are used, and in the rearrangeably nonblocking, manual wiring operations may occur and the operation costs may increase because the expected connection patterns cannot be achieved.

In order to address such a situation, a technique to enumerate network configurations that fall somewhere in between the strictly nonblocking and the rearrangeably nonblocking, and finding a configuration among them in which the probability of becoming blocked in the expected connection patterns is sufficiently small and the number of mechanical patch panels used is minimal is considered. In practice, it is possible to define an intermediate configuration that is a rearrangeably nonblocking configuration when $\alpha=0$ and is a strictly nonblocking configuration when $\alpha=1$ by introducing a parameter $\alpha \in [0, 1]$. Thus, the network configuration may be calculated for each $\alpha$. However, because the parameter $\alpha \in [0, 1]$ is a real number, the possible value is infinite, and this calculation is not possible. There is also no guarantee that a correct set of network configurations can be obtained in the calculation of finite points.

The present disclosure proposes a technique that ensures that a correct set of network configurations is obtained in the calculation of finite points. The proposed technique utilizes the ability to omit searching for the network configuration in certain parameter intervals $[\beta, \gamma]$ (Proposition 1, 2) to ensure that the correct set of network configurations is obtained, and the searches are completed at high speed using the fact that the search range gets halved.

Note that the device according to the present invention can also be implemented by a computer and a program. The program can be recorded in a recording medium or provided through a network.

INDUSTRIAL APPLICABILITY

The present disclosure can be applied in the information communication industry.

REFERENCE SIGNS LIST

10 Network configuration enumeration device
11 Parameter input unit
12 Global search unit
13 Optimization calculation unit
14 Partial search unit
15 Network configuration set output unit

The invention claimed is:

1. A network configuration enumeration device, using parameters α calculated by using, when a number C of accommodatable wiring lines in mechanical patch panels having an input layer, an intermediate layer, and an output layer is obtained, a number of connections with the intermediate layer per one mechanical patch panel, and a number of input terminals and the number of output terminals per one mechanical patch panel in a search range, and calculating a network configuration of the input layer, the intermediate layer, and the output layer that minimizes the number of mechanical patch panels from among α-quasi-nonblocking configurations of which the number of accommodatable wiring lines is greater than or equal to C, for each of all the parameters α.

2. A network configuration enumeration program for causing a computer to be implemented as functional units included in the network configuration enumeration device according to claim 1.

3. The network configuration enumeration device according to claim 1, wherein the network configuration enumeration device calculates a combination of a number k of mechanical patch panels in the input layer and the output layer, a number l of mechanical patch panels in the intermediate layer, a number m of connections with the intermediate layer per one mechanical patch panel, and a number n of input terminals and a number of output terminals per one mechanical patch panel, as the network configuration that minimizes the number of mechanical patch panels, from among the α-quasi-nonblocking configurations, by using the parameters α, defined by Equation C21, in a search range,

[Math. C21]

$$\alpha(x) = \begin{cases} \dfrac{l_x - q_x}{q_x - 1} & q_x > 1 \\ 1 & q_x = 1 \end{cases} \quad (C21)$$

where $q_x$ is represented as follows;

[Math C22]

$$q_x = \lceil n_x / m_x \rceil \quad \text{[Math C22]}$$

when $k_x = k$, $l_x = l$, $m_x = m$, $n_x = n$ for the network configuration x=(k, l, m, n).

4. The network configuration enumeration device according to claim 3, wherein
the network configuration enumeration device calculates a combination of the number k, the number l, the number m, and the number n that minimizes the number of mechanical patch panels from among the α-quasi-nonblocking configurations, by further using a parameter δ, defined by Equation C31, in a search range,

[Math. C31]

$$\delta(y, z) = \dfrac{1}{l_y(2k_z + l_z)} \quad (C31)$$

where y and z are network configurations at both ends of the search range, $l_y$ is l in the network configuration y=(k, l, m, n), and $k_z$, and $l_z$ are k and l in the network configuration z=(k, l, m, n).

5. A network configuration enumeration method, comprising:
using parameters α calculated by using, when a number C of accommodatable wiring lines in mechanical patch panels having an input layer, an intermediate layer, and an output layer is obtained, a number of connections with the intermediate layer per one mechanical patch panel, and a number of input terminals and a number of output terminals per one mechanical patch panel in a search range, and
calculating a network configuration of the input layer, the intermediate layer, and the output layer that minimizes the number of mechanical patch panels from among α-quasi-nonblocking configurations of which the number of accommodatable wiring lines is greater than or equal to C, for each of all the parameters α.

* * * * *